United States Patent
Lee et al.

(10) Patent No.: US 8,367,527 B2
(45) Date of Patent: Feb. 5, 2013

(54) METHOD OF FABRICATING POLYCRYSTALLINE SILICON THIN FILM

(75) Inventors: Won Tae Lee, Gyeonggi-Do (KR); Han Sick Cho, Gyeonggi-Do (KR); Hyung Su Kim, Seoul (KR)

(73) Assignee: Nokord Co., Ltd. (KR)

( * ) Notice: Subject to any disclaimer, the term of this patent is extended or adjusted under 35 U.S.C. 154(b) by 0 days.

(21) Appl. No.: 13/301,368

(22) Filed: Nov. 21, 2011

(65) Prior Publication Data

US 2012/0064702 A1  Mar. 15, 2012

Related U.S. Application Data

(63) Continuation of application No. PCT/KR2010/001761, filed on Mar. 23, 2010.

(30) Foreign Application Priority Data

May 22, 2009  (KR) .................. 10-2009-0045191

(51) Int. Cl.
   *H01L 21/20* (2006.01)
   *H01L 21/36* (2006.01)
   *C23C 16/24* (2006.01)

(52) U.S. Cl. ........ 438/488; 438/489; 438/491; 438/166; 438/486; 438/487; 257/70; 257/75; 257/E21.133

(58) Field of Classification Search .......... 438/166, 438/486, 487, 488–491, 649, 651, 660; 257/E21.133, 70, 75
   See application file for complete search history.

(56) References Cited

U.S. PATENT DOCUMENTS

| 2006/0252235 A1* | 11/2006 | Aberle et al. .......... 438/478 |
| 2006/0270129 A1* | 11/2006 | Paik .................. 438/166 |
| 2008/0268622 A1* | 10/2008 | Van Gestel ............ 438/486 |

FOREIGN PATENT DOCUMENTS

| JP | 2003068642 A | 3/2003 |
| JP | 2006216658 A | 8/2006 |
| KR | 100220207 B1 | 9/1999 |
| KR | 20040061795 A | 7/2004 |

OTHER PUBLICATIONS

International Search Report and Written Opinion of the International Searching Authority; Application No. PCT/KR2010/001761; Issued: Oct. 29, 2010; Date of Mailing: Oct. 29, 2010; 5 pages.

* cited by examiner

*Primary Examiner* — Kimberly Rizkallah
*Assistant Examiner* — Maria Ligai
(74) *Attorney, Agent, or Firm* — St. Onge Steward Johnston & Reens LLC

(57) ABSTRACT

A method of fabricating a polycrystalline silicon thin that includes a metal layer forming operation of forming a metal layer on an insulating substrate, a first silicon layer forming operation of stacking a silicon layer on the metal layer formed in the metal layer forming operation, a first annealing operation of forming a silicide layer using by moving catalyst metal atoms from the metal layer to the silicon layer using an annealing process, a second silicon layer forming operation of stacking an amorphous silicon layer on the silicide layer, and a crystallization operation of crystallizing the amorphous silicon layer into crystalline silicon through the medium of particles of the silicide layer.

7 Claims, 8 Drawing Sheets

METHOD OF FABRICATING POLYCRYSTALLINE SILICON THIN FILM

CROSS-REFERENCE TO RELATED APPLICATIONS

The present application is a continuation of pending International patent application PCT/KR2010/001761 filed on Mar. 23, 2010 which designates the United States and claims priority from Korean patent application 10-2009-0045191 filed on May 22, 2009, the content of which is incorporated herein by reference.

FIELD OF THE INVENTION

The present invention relates to a method of fabricating a polycrystalline silicon (poly-Si) thin film used in solar cells, and more particularly, to a method of effectively fabricating a poly-Si thin film using an amorphous silicon (a-Si) thin film due to a metal-induced crystallization (MIC) process.

BACKGROUND OF THE INVENTION

In general, most problems during fabrication of polycrystalline silicon (poly-Si) may occur because a process temperature cannot be sufficiently raised to a temperature at which an amorphous silicon (a-Si) thin film is crystallized due to the use of a glass substrate vulnerable to a high temperature.

In the fabrication of poly-Si, the processes that require a high-temperature annealing process may be a crystallization process of changing an a-Si thin film into a crystalline silicon thin film and a dopant activation process including a doping process and an electrical activation process.

Presently, various low-temperature poly-Si (LTPS) processes of forming a poly-Si thin film in a small amount of time at a low temperature allowed by a glass substrate have been proposed. Typical methods of forming poly-Si thin films may include a solid-phase crystallization (SPC) process, an excimer laser annealing (ELA) process, and a metal-induced crystallization (MIC) process.

An SPC process is the most direct and oldest method of forming a poly-Si layer from a-Si. The SPC process may include annealing an a-Si thin film at a temperature of about 600° C. or higher for several tens of hours to form a poly-Si thin film that has crystal grains with a size of about several micrometers. The poly-Si thin film obtained using the SPC process may have a high defect density in the crystal grains, it is difficult to adopt a glass substrate due to a high annealing temperature, and a process time may be increased due to an annealing process with long duration.

An ELA process includes instantaneously irradiating excimer laser beams to an a-Si layer for nano-seconds to melt and recrystallize the a-Si layer without damaging a glass substrate.

However, the ELA process is known to be highly problematic in terms of mass production. In the ELA process, a poly-Si thin film has a very non-uniform grain structure according to laser irradiation. The ELA process, which has a narrow process range, may preclude formation of a uniform crystalline silicon thin film. Also, the poly-Si thin film that has a rough surface may adversely affect device characteristics. This problem may be more serious when the poly-Si layer is applied to an organic light-emitting diode (OLED), which is significantly affected by the uniformity of a thin-film transistor (TFT).

An MIC process was proposed to overcome the above-described problems. The MIC process may include coating a metal catalyst on a-Si using a sputtering process or a spin coating process and inducing crystallization of the a-Si using a low-temperature annealing process. Various metals, such as nickel (Ni), copper (Cu), aluminum (Al), and palladium (Pd), may be used as the metal catalyst. In general, the MIC process may be performed using Ni as the metal catalyst because a reaction may be easily controlled and large grains may be obtained. Although the MIC process may be enabled at a temperature lower than about 450° C., the MIC process is quite problematic in terms of actual mass production. Specifically, a considerable amount of metal that diffused into an activation region of a TFT may lead to typical metal contamination, thereby increasing a leakage current, which is a TFT characteristic.

While an LTPS was originally developed in an attempt to apply the LTPS to a liquid crystal display (LCD), the development of the LTPS has been required more and more with the recent introduction of active-matrix organic light-emitting diodes (AMOLEDs) and thin-film poly-Si solar cells.

A method of fabricating a poly-Si thin layer at low cost in high yield may be imperatively required in that AMOLEDs will compete with a-Si TFT LCDs for plenty of display product groups in the market in the near future. In addition, a method of fabricating a poly-Si thin layer may be significantly considered in that AMOLEDs will also compete with crystalline wafers in solar cells. Accordingly, the production cost and marketing competitiveness of products may depend on techniques of fabricating a poly-Si thin layer at lower costs in more stable manners as compared with a-Si TFT LCDs and solar cells including crystalline wafers of which fabrication techniques have come to stabilization stages.

FIG. 1 is a schematic diagram illustrating a conventional process of fabricating a poly-Si thin layer from a-Si using an MIC process. Referring to FIG. 1, in the conventional process, a buffer layer 2 formed of silicon oxide ($SiO_2$) may be formed on a substrate 1, such as a glass substrate, and an a-Si layer 3 may be formed on the buffer layer 2 using a plasma-enhanced chemical vapor deposition (PECVD) process. Then, a metal, such as nickel (Ni), may be coated on the a-Si layer 3 using a sputtering process and annealed using a rapid thermal annealing (RTA) process at a temperature of about 700° C. so that the a-Si layer 3 is crystallized into crystalline silicon 5. However, according to the conventional process, since it is difficult to precisely control the amount of a metal coated on the a-Si layer 3, removing an excessively coated metal may be problematic. The removal of the excessively coated metal may not only lead to an increase in fabrication costs but also detrimentally affect the quality of crystalline silicon.

SUMMARY OF THE INVENTION

The present invention provides a method of efficiently fabricating a polycrystalline silicon (poly-Si) thin film using a metal-induced crystallization (MIC) process by precisely controlling the amount of a metal catalyst and enabling a crystallization process at a low temperature.

According to an aspect of the present invention, there is provided a method of fabricating a polycrystalline silicon (poly-Si) thin film, the method including a metal layer forming operation of forming a metal layer on an insulating substrate;

an oxide layer forming operation of forming a metal oxide layer on a surface of the metal layer by annealing the metal layer or by depositing the metal oxide layer;

a first silicon layer forming operation of stacking a silicon layer on the metal oxide layer formed in the oxide layer forming operation;

a first annealing operation of forming a silicide layer by moving metal catalyst atoms from the metal layer to the first silicon layer using an annealing process;

a second silicon layer forming operation of stacking an amorphous silicon (a-Si) layer on the silicide layer; and a crystallization operation of crystallizing the a-Si layer into a crystalline silicon layer through the medium of particles of the silicide layer using an annealing process.

In a method of fabricating a polycrystalline silicon (poly-Si) thin film according to the present invention, the amount of a metal catalyst that diffuses into an amorphous silicon (a-Si) layer and functions as silicon crystallization nuclei in the a-Si layer can be precisely controlled, thereby enabling effective fabrication of the poly-Si thin layer. Also, the method of fabricating a poly-Si thin film, according to the present invention, can enable a crystallization process at a lower temperature than a conventional method.

DETAILED DESCRIPTION OF THE INVENTION

| Description of Major Symbol in the above Figures | |
|---|---|
| 10: Substrate | 20: Buffer layer |
| 30: Metal layer | 40: First silicon layer |
| 50: Silicon nitride layer | 55: Silicide layer |
| 60: Second silicon layer | 70: Crystalline silicon |
| S1: Metal layer forming operation | |
| S2: Oxide layer forming operation | |
| S3: Patterning operation | |
| S4: First silicon layer forming operation | |
| S5: Excessive catalyst capture layer forming operation | |
| S6: First annealing operation | |
| S7: Etching operation | |
| S8: Second silicon layer forming operation | |
| S9: Crystallization operation | |

The present invention will be described in detail with reference to the accompanying drawings, in which exemplary embodiments of the invention are shown.

Figure 1:
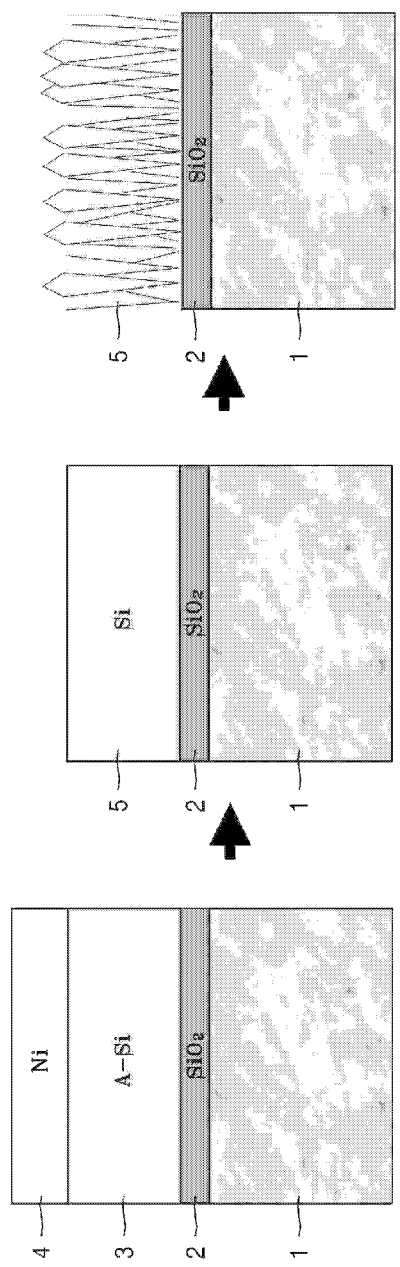
FIG. 1 is a diagram illustrating a conventional process of fabricating a polycrystalline silicon (poly-Si) thin film using a metal-induced crystallization (MIC) process.
Figure 2:
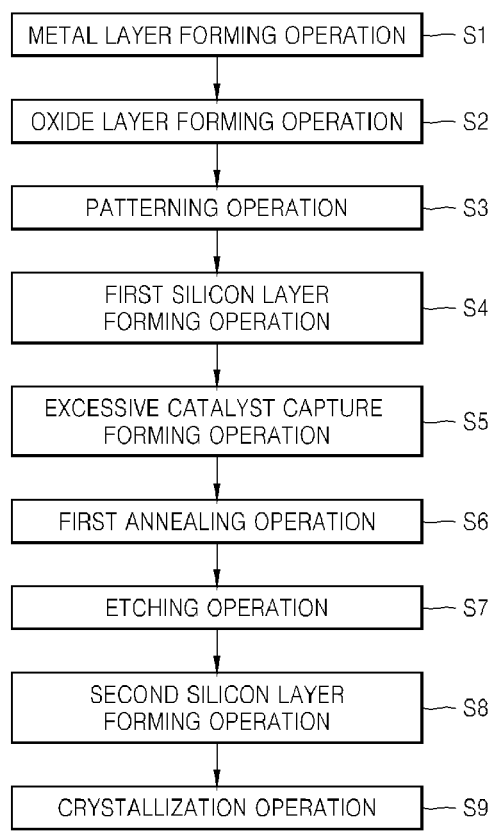
FIG. 2 is a flowchart of a fabrication process according to an exemplary embodiment of the present invention.
Figure 3:
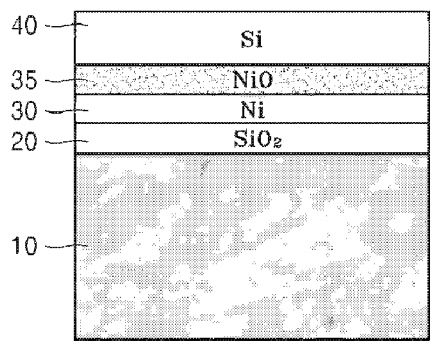
FIG. 3 is a cross-sectional view of the resultant structure where a first silicon layer of an operation of FIG. 2 is formed.
Figure 4:
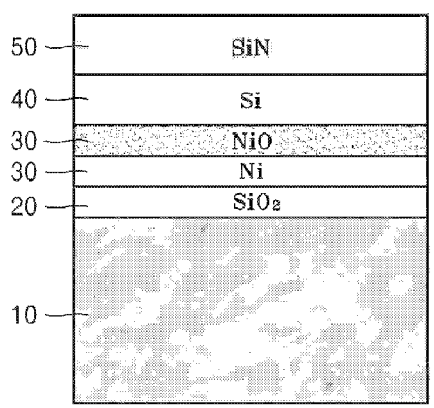
FIG. 4 is a cross-sectional view of the resultant structure where an excessive catalyst capture layer of an operation of FIG. 2 is formed.
Figure 5:
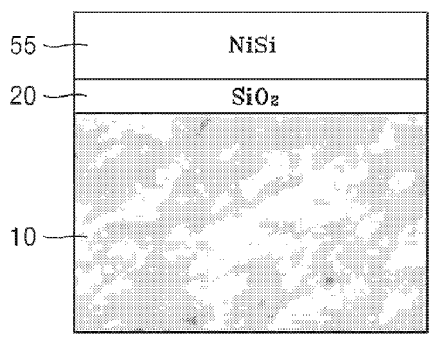
FIG. 5 is a cross-sectional view of the resultant structure resulting from an etching process of FIG. 2.
Figure 6:
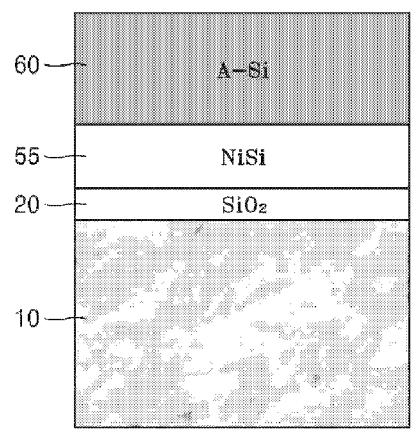
FIG. 6 is a cross-sectional view of the resultant structure where a second silicon layer of an operation of FIG. 2 is formed.
Figure 7:
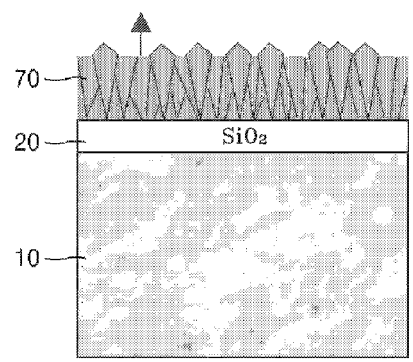
FIG. 7 is a schematic diagram of a substrate on which a poly-Si layer is formed after a crystallization process of FIG. 2.

FIG. 2 is a flowchart of a fabrication process according to an exemplary embodiment of the present invention. FIG. 3 is a cross-sectional view of the resultant structure where a first silicon layer of an operation of FIG. 2 is formed. FIG. 4 is a cross-sectional view of the resultant structure where an excessive catalyst capture layer of an operation of FIG. 2 is formed. FIG. 5 is a cross-sectional view of the resultant structure resulting from an etching process of FIG. 2. FIG. 6 is a cross-sectional view of the resultant structure where a second silicon layer of an operation of FIG. 2 is formed.

Referring to FIGS. 2 through 6, a method of fabricating a polycrystalline silicon (poly-Si) thin film according to an exemplary embodiment of the present invention (hereinafter, referred to as "fabrication method") may include a metal layer forming operation 51, an oxide layer forming operation S2, a patterning operation S3, a first silicon layer forming operation S4, an excessive catalyst capture layer forming operation S5, a first annealing operation S6, an etching operation S7, a second silicon layer forming operation S8, and a crystallization operation S9.

In the metal layer forming operation 51, a metal layer 30, such as nickel (Ni), may be formed on an insulating substrate 10, such as a glass substrate. The substrate 10 may include a buffer layer 20 formed of a material, such as silicon oxide (SiO$_2$). The buffer layer 20 may be prepared to function as an insulator. Also, the buffer layer 20 may be prepared to prevent diffusion of impurities from the substrate 10 into a below-described first silicon layer 40 or second silicon layer 60 and contamination of the first silicon layer 40 or the second silicon layer 60 by the impurities in the subsequent oxide layer forming operation S2, the first annealing operation S6, or the crystallization operation S9. The metal layer 30 may be formed using a known process, such as a sputtering process or a plasma-enhanced chemical vapor deposition (PECVD) process. The metal layer 30 may have a thickness of about 5 Å to 1500 Å. When the metal layer 30 has a thickness less than about 5 Å, process reproducibility may be degraded due to an excessively small thickness of the metal layer 30, and the uniformity of the metal layer 30 may be degraded when the metal layer 30 is deposited over a large area. When the metal layer 30 has a thickness more than about 1500 Å, an excessively large amount of metal may diffuse into the second silicon layer 60 to cause contamination of the second silicon layer 60, thereby degrading characteristics of a device that includes poly-Si formed in the crystallization operation S9 that is described below.

In the oxide layer forming operation S2, the metal layer 30 may be annealed in an atmosphere of any one of vacuum, air, oxygen, and nitrogen to form a metal oxide layer 35, such as nickel oxide (NiO or $Ni_2O_3$), on a surface of the metal layer 30. Alternatively, the metal oxide layer 35 may be deposited on the metal layer 30 to form the metal oxide layer 35. The metal oxide layer 35 may be formed at an annealing temperature of about 400° C. to 1000° C. When the metal oxide layer 35 is formed at an annealing temperature lower than about 400° C., nickel oxide may not be properly formed. When the metal oxide layer 35 is formed at an annealing temperature higher than about 1000° C., the substrate 10 formed of glass may be deformed or damaged due to thermal shock. In the oxide layer forming operation S2, the annealing process may use a furnace process, a rapid thermal anneal (RTA) process, and a UV annealing process. The metal oxide layer 35 may serve to lower activation energy during diffusion of a metal catalyst in the formation of a silicide layer 55 during the first annealing operation S6 that is described below. The metal oxide layer 35 may have a thickness of about 1 Å to 300 Å. When the metal oxide layer 35 has a thickness less than about 1 Å, the metal oxide layer 35 may not perform proper operations due to an excessively small thickness. When the metal oxide layer 35 has a thickness more than about 300 Å, diffusing the metal catalyst from the metal layer 30 may be difficult.

In the patterning operation S3, after the oxide layer forming operation S2, a portion of the metal oxide layer 35 may be removed using photolithography or etching processes and patterned to expose the metal layer 30. The patterning operation S3 may be omitted as needed. The patterning operation S3 may be required to uniformly distribute growth nuclei of crystalline silicon.

In the first silicon layer forming operation S4, the first silicon layer 40 formed of amorphous silicon (a-Si) may be formed on the metal oxide layer 35 using a known process, such as a PECVD process. The first silicon layer 40 may have a thickness of about 5 Å to 1500 Å. When the first silicon layer 40 has a thickness less than about 5 Å, process reproducibility may be degraded due to an excessively small thickness of the first silicon layer 40, and the uniformity of the first silicon layer 40 may be degraded when the first silicon layer 40 is deposited over a large area. When the first silicon layer 40 has a thickness more than about 1500 Å, the first silicon layer 40 may combine with the metal layer 30 to cause a chemical combination that is not required to form the silicide layer 55. In addition, a ratio of the thickness of the metal layer 30 to the thickness of the first silicon layer 40 may range from 1:0.5 to 1:6. When the ratio of the thickness of the metal layer 30 to the thickness of the first silicon layer 40 is outside the above-described range, the above-described chemical combination that is not required to form the silicide layer 55 may be caused. That is, a chemical combination that has a different composition from a silicide composition required for metal-induced combination may be caused to hinder inductive crystallization.

In the excessive catalyst capture layer forming operation S5, a silicon nitride (SiN) layer 50 may be formed on the first silicon layer 40. A method of forming the SiN layer 50 includes stacking SiN particles on the first silicon layer 40 using a known process, such as a PECVD process. The SiN layer 50 may have a thickness of about 100 Å or more. When the SiN layer 50 has a thickness less than about 100 Å, the SiN layer 50 may not be uniformly formed over a wide area due to an excessively small thickness thereof, and an excessive catalyst cannot be properly captured.

In the first annealing operation S6, an annealing process may be performed so that metal catalyst atoms, such as nickel (Ni), can pass from the metal layer 30 to the first silicon layer 40 through the metal oxide layer 35 to form the silicide layer 55. In the first annealing operation S6, the annealing process may include a furnace process, an RTA process, or a UV annealing process. The silicide layer 55 formed in the first annealing operation S6 may function as nuclei for crystallizing the a-Si in a below-described crystallization operation S9.

In the etching operation S7, after the first annealing operation S6, the SiN layer 50 stacked in the excessive catalyst capture layer forming operation S5 may be removed. Since a method of removing the SiN layer 50 may be performed using a known etching process, a detailed description thereof is omitted.

In the second silicon layer forming operation S8, the second silicon layer 60 may be formed by stacking a-Si on the silicide layer 55. A method of forming the second silicon layer 60 may be performed using a known process, such as a PECVD process.

In the crystallization operation S9, the second silicon layer 60 formed of a-Si may be annealed to form crystalline silicon 70 through the medium of metal particles of the silicide layer 55. In the crystallization operation S9, the annealing process may be performed at a temperature of about 630° C. using an RTA apparatus.

To analyze a crystalline state of a poly-Si thin film fabricated using the above-described method, the size of crystal grains was observed and the wave number of the poly-Si thin layer at the maximum intensity was analyzed using an optical microscope and Raman Spectroscopy.

Figure 8:
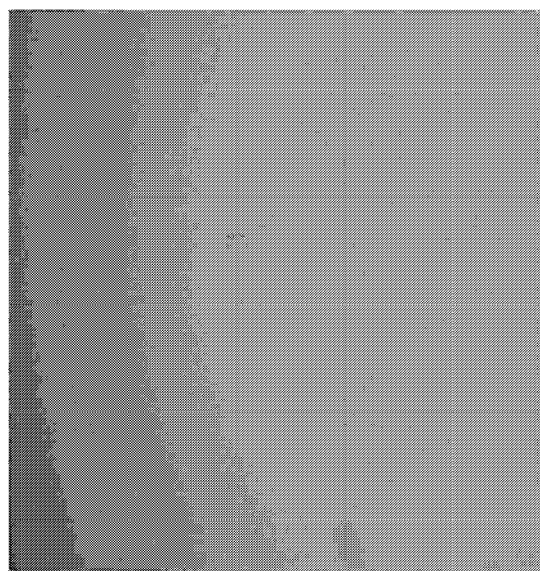
FIG. 8 is an optical microscopic image of the surface of an a-Si layer.
Figure 9:
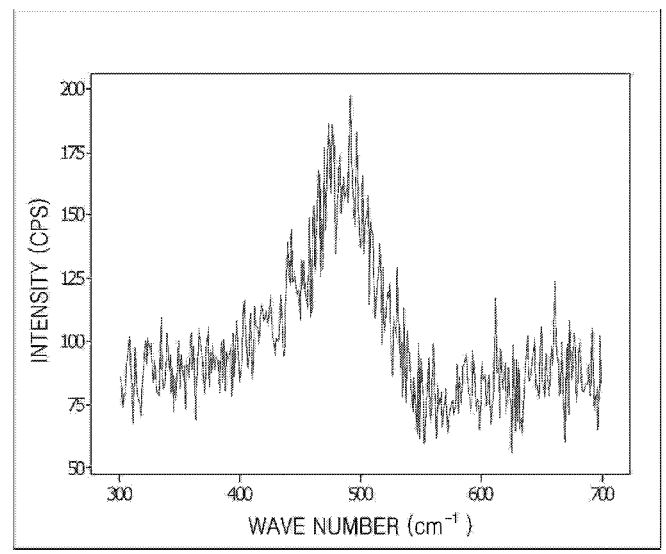
FIG. 9 is a graph showing the wave number of the a-Si layer shown in FIG. 8.
Figure 10:
FIG. 10 is an optical microscopic image of the surface of a crystalline silicon wafer.
Figure 11:
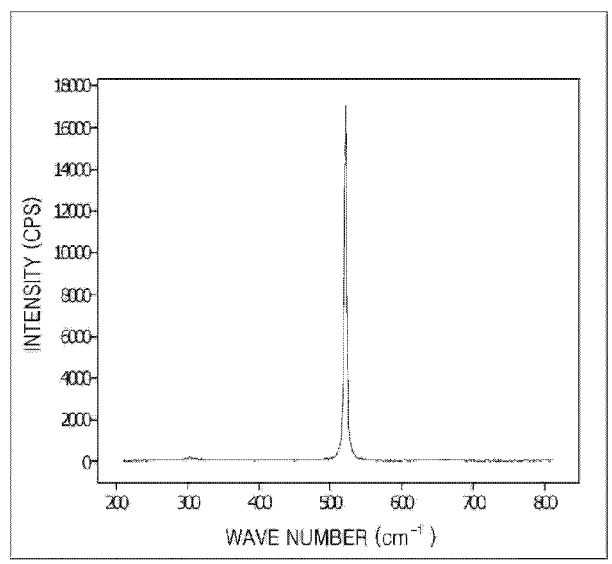
FIG. 11 is a graph showing the wave number of the crystalline silicon wafer shown in FIG. 10.
Figure 12:
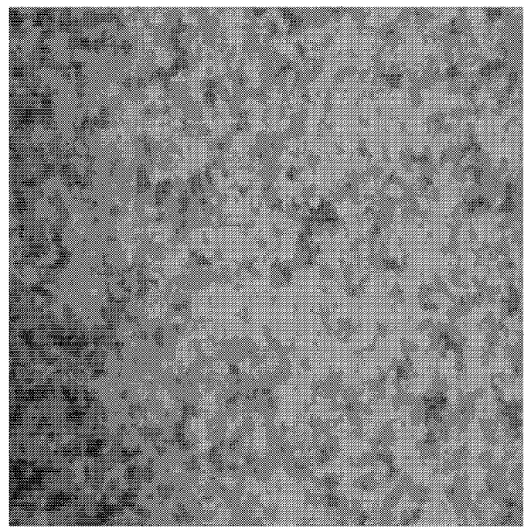
FIG. 12 is an optical microscopic image of the surface of a poly-Si thin film fabricated using a conventional MIC process.
Figure 13:
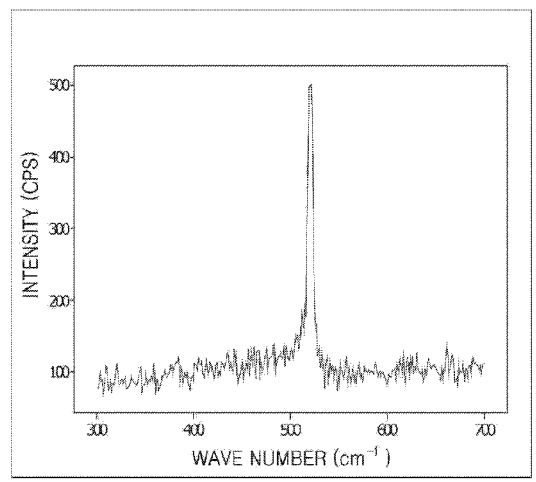
FIG. 13 is a graph showing the wave number of the poly-Si thin film shown in FIG. 12.
Figure 14:
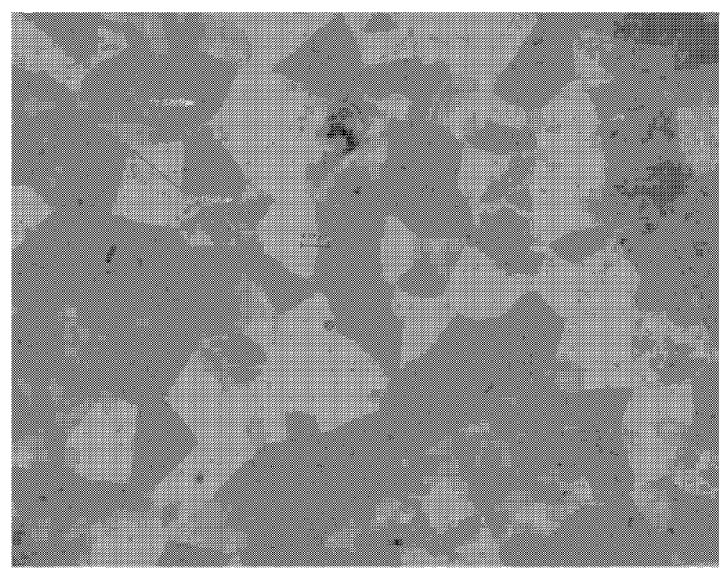
FIG. 14 is an optical microscopic image of the surface of a poly-Si thin film fabricated according to the present invention.
Figure 15:
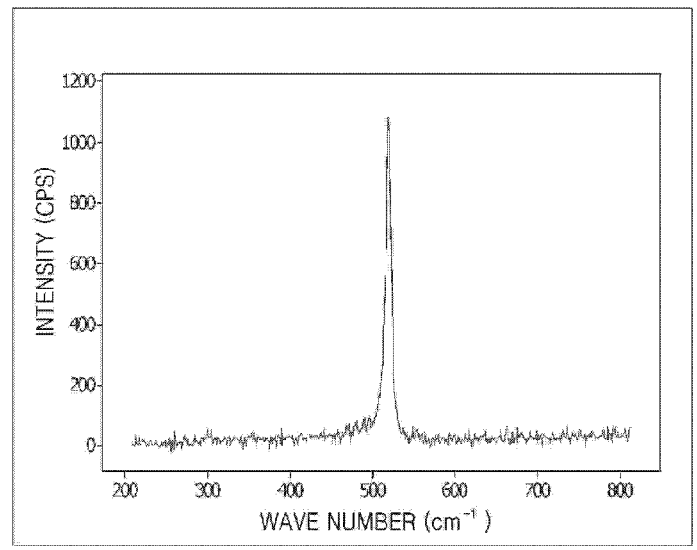
FIG. 15 is a graph showing the wave number of the poly-Si thin film shown in FIG. 14.

FIG. 8 is an optical microscopic image of the surface of an a-Si layer. FIG. 9 is a graph showing the wave number of the a-Si layer shown in FIG. 8. FIG. 10 is an optical microscopic image of the surface of a crystalline silicon wafer. FIG. 11 is a graph showing the wave number of the crystalline silicon wafer shown in FIG. 10. FIG. 12 is an optical microscopic image of the surface of a poly-Si thin film fabricated using a conventional MIC process. FIG. 13 is a graph showing the wave number of the poly-Si thin film shown in FIG. 12. FIG. 14 is an optical microscopic image of the surface of a poly-Si thin film fabricated according to the present invention. FIG. 15 is a graph showing the wave number of the poly-Si thin film shown in FIG. 14.

Referring to FIGS. 8 and 9, the second silicon layer 60 formed of a-Si had a maximum intensity at a wave number of 480 $cm^{-1}$. In FIG. 9, an abscissa denotes wave number ($cm^{-1}$) corresponding to an oscillation frequency. A wave number refers to a unit of the oscillation frequency, which denotes the number of waves within a unit distance and is obtained by dividing the oscillation frequency of light by the speed of light in atomic, molecular, or nuclear spectroscopy. Specifically, an oscillation frequency of a specific wave is denoted by the Greek letter ν, which is the speed c of light divided by a wavelength λ. That is, $\nu = c/\lambda$. A typical spectral line has a wavelength of $5.8 \times 10^{-5}$ cm and an oscillation frequency of $5.17 \times 10^{14}$ Hz in the visible range of the spectrum. However, since the typical spectral line has an excessively high oscillation frequency, it is convenient to obtain a small value by dividing the oscillation frequency by the speed of light. From the above Equation $\nu = c/\lambda$, the oscillation frequency ν/c divided by the speed of light is equal to 1/λ. When the wavelength λ is calculated in units of m, 1/λ denotes the number of waves observed within a distance of 1 m. The wave number may be mostly measured in units of 1/m (i.e., $m^{-1}$) and 1/cm (i.e., $cm^{-1}$).

In FIG. 9, an ordinate denotes intensity (count per second (CPS)), which corresponds to the sum of wave numbers measured per unit time. The units of abscissa and ordinate of FIGS. 11, 13, and 15 are the same as in FIG. 9. In comparison, as shown in FIGS. 10 and 11, the crystalline silicon wafer formed of typical crystalline silicon exhibited a maximum intensity at a wave number of 520 $cm^{-1}$. FIGS. 12 and 13 are respectively an optical microscopic image and wave number graph of the poly-Si thin film fabricated using a conventional MIC process. Referring to FIGS. 12 and 13, the poly-Si thin layer exhibited a maximum intensity at a similar wave number to the crystalline silicon wafer shown in FIGS. 10 and 11. However, referring to the optical microscopic image shown in FIG. 12, which is magnified 1000 times, it can be observed that the poly-Si thin layer has relatively small crystal grains.

FIGS. 14 and 15 are respectively an optical microscopic image and wave number graph of the poly-Si thin film fabricated according to the present invention. Referring to FIG. 15, it can be seen that a wave number at which the poly-Si thin film fabricated according to the present invention has a maximum intensity is as clear as the crystalline silicon wafer shown in FIG. 11. Also, FIG. 14 is an optical microscopic image magnified 1000 times. When comparing FIG. 14 with FIG. 12, it can be observed that the poly-Si thin film fabricated according to the present invention has far greater crystal grains than the poly-Si thin film fabricated using the conventional method. From the above experimental results, it can be concluded that a method of fabricating a poly-Si thin layer, according to the present invention, is superior to the conventional method. Furthermore, the method of fabricating a poly-Si thin film, according to the present invention, may enable a crystallization operation at a lower temperature than in the conventional method. In the method of fabricating a poly-Si thin layer, according to the present invention, a metal catalyst that functions as a nucleus for a reaction of transition from a-Si to crystalline Si may be disposed under the a-Si layer to precisely control the amount of the metal catalyst beforehand. Thereafter, the metal catalyst may be allowed to diffuse into the a-Si layer to prevent impurities from flowing into the a-Si layer and lower activation energy.

Although the exemplary embodiment of the present invention describes that the patterning operation of removing the portion of the oxide layer using photolithography and etching processes to expose the metal layer is performed after the oxide layer forming operation and before the first silicon layer forming operation, the patterning operation may be omitted if desired.

Although the exemplary embodiment of the present invention describes that the method further includes the excessive catalyst capture layer forming operation of forming the silicon nitride layer on the first silicon layer after the first silicon layer forming operation; and the etching operation of removing the silicon nitride layer by etching, after the first annealing operation, even if the excessive catalyst capture layer forming operation and the etching operation are omitted, the object of the present invention may be attained.

Unlike in the exemplary embodiment of the present invention, a method of fabricating a poly-Si thin film may include a first silicon layer forming operation of stacking a-Si on an insulating substrate, an oxide layer forming operation of forming a metal oxide layer on the a-Si using a mixture of a metal and an oxide of the metal, a second silicon layer forming operation of stacking a-Si on the oxide layer, and a crystallization operation of growing the a-Si of the first silicon layer into crystalline silicon by an annealing process using metal particles of the oxide layer as a catalyst. That is, unlike in the exemplary embodiment of the present invention, an oxide layer may be formed on a substrate without forming a metal layer, and the same subsequent processes as in the exemplary embodiment of the present invention may be performed.

While the present invention has been particularly shown and described with reference to exemplary embodiments thereof, it will be understood by those of ordinary skill in the art that various changes in form and details may be made therein without departing from the spirit and scope of the present invention as defined by the following claims.

To attain the above-described objects, a method of fabricating a polycrystalline silicon (poly-Si) thin film, according to the present invention, includes a metal layer forming operation of forming a metal layer on an insulating substrate;

an oxide layer forming operation of forming a metal oxide layer on a surface of the metal layer by annealing the metal layer or of forming a metal oxide layer by depositing the metal oxide layer on the metal layer;

a first silicon layer forming operation of stacking a silicon layer on the metal oxide layer formed in the oxide layer forming operation;

a first annealing operation of moving atoms of a metal catalyst from the metal layer to the first silicon layer using an annealing process to form a silicide layer;

a second silicon layer forming operation of stacking an a-Si layer on the silicide layer; and a crystallization operation of crystallizing the a-Si layer into a crystalline silicon layer using an annealing process through the medium of particles of the silicide layer.

The substrate may include a buffer layer interposed between the substrate and the metal layer and formed of $SiO_2$.

After the first silicon layer forming operation, the method may further include an excessive catalyst forming operation of forming a SiN layer on the first silicon layer; and an etching operation of removing the SiN layer by etching, after the first annealing operation.

The metal layer may have a thickness of about 5 to 1500 Å, the oxide layer may have a thickness of about 1 Å to 300 Å, the first silicon layer may have a thickness of about 5 Å to 1500 Å, and a ratio of the thickness of the metal layer to the thickness of the first silicon layer may range from 1:0.5 to 1:6.

The oxide layer forming operation may be performed at an annealing temperature of about 400° C. to 1000° C., and the first annealing operation may be performed at an annealing temperature of about 300° C. to 1000° C.

A patterning operation of removing a portion of the oxide layer using photolithography or etching processes to expose the metal layer after the oxide layer forming operation and before the first silicon layer forming operation.

To attain the above-described objects, a method of fabricating a poly-Si thin film, according to another exemplary embodiment of the present invention, may include a first silicon layer forming operation of stacking a-Si on an insulating substrate;

an oxide layer forming operation of forming a metal oxide layer on the a-Si using a mixture of a metal and an oxide of the metal;

a second silicon layer forming operation of stacking a-Si on the metal oxide layer; and a crystallization operation of growing the a-Si of the first silicon layer into crystalline silicon by an annealing process using metal particles of the metal oxide layer as a catalyst.

What is claimed is:

1. A method of fabricating a polycrystalline silicon (poly-Si) thin film, the method comprising:
   a metal layer forming operation of forming a metal layer on an insulating substrate;
   an oxide layer forming operation of forming a metal oxide layer on a surface of the metal layer by annealing the metal layer or by depositing the metal oxide layer;
   a first silicon layer forming operation of stacking a silicon layer on the metal oxide layer formed in the oxide layer forming operation;
   a first annealing operation of forming a silicide layer by moving metal catalyst atoms from the metal layer to the first silicon layer using an annealing process;
   a second silicon layer forming operation of stacking an amorphous silicon (a-Si) layer on the silicide layer; and
   a crystallization operation of crystallizing the a-Si layer into a crystalline silicon layer through the medium of particles of the silicide layer using an annealing process.

2. The method of claim 1, wherein the substrate comprises a buffer layer interposed between the substrate and the metal layer and is formed of $SiO_2$.

3. The method of claim 2, further comprising:
   an excessive catalyst capture layer forming operation of forming a silicon nitride (SiN) layer on the first silicon layer after the first silicon layer forming operation; and
   an etching operation of removing the SiN layer by etching, after the first annealing operation.

4. The method of claim 1, further comprising:
   an excessive catalyst capture layer forming operation of forming a silicon nitride (SiN) layer on the first silicon layer after the first silicon layer forming operation; and
   an etching operation of removing the SiN layer by etching, after the first annealing operation.

5. The method of claim 4, wherein the oxide layer forming operation is performed at an annealing temperature of about 400° C. to 1000° C., and the first annealing operation is performed at an annealing temperature of about 300° C. to 1000° C.

6. The method of claim 1, wherein the metal layer has a thickness of about 5 Å to 1500 Å, the metal oxide layer has a thickness of about 1 Å to 300 Å, the first silicon layer has a thickness of about 5 Å to 1500 Å, and a ratio of the thickness of the metal layer to the thickness of the first silicon layer ranges from 1:0.5 to 1:6.

7. The method of claim 1, further comprising a patterning operation of removing a portion of the metal oxide layer using photolithography or etching processes to expose the metal layer after the oxide layer forming operation and the first silicon layer forming operation.

* * * * *